United States Patent [19]

Abdi et al.

[11] Patent Number: 5,722,052
[45] Date of Patent: Feb. 24, 1998

[54] SWITCHING CURRENT MIRROR FOR A PHASE LOCKED LOOP FREQUENCY SYNTHESIZER AND COMMUNICATION DEVICE USING SAME

[75] Inventors: Behrooz L. Abdi, Gilbert, Ariz.; David M. Gonzalez, Elgin; Alex W. Hietala, Cary, both of Ill.

[73] Assignee: Motorola, Inc., Schaumburg, Ill.

[21] Appl. No.: 607,914

[22] Filed: Feb. 28, 1996

[51] Int. Cl.$^6$ .................. H04B 1/40; H03F 3/45
[52] U.S. Cl. .............. 455/75; 455/260; 327/157; 330/253
[58] Field of Search .................... 455/75, 76, 86, 455/260; 327/157, 390, 536; 330/253, 257, 288

[56] References Cited

U.S. PATENT DOCUMENTS

| | | | |
|---|---|---|---|
| 4,561,101 | 12/1985 | Pinsard et al. | 455/260 |
| 4,875,018 | 10/1989 | Draxelmayr | 330/288 |
| 5,142,696 | 8/1992 | Kosiec et al. | 455/260 |
| 5,304,869 | 4/1994 | Creason | 330/253 |
| 5,331,293 | 7/1994 | Shepherd et al. | 455/76 |
| 5,359,299 | 10/1994 | Webster | 327/157 |
| 5,422,604 | 6/1995 | Jokura | 455/260 |
| 5,495,206 | 2/1996 | Hietala | 455/76 |
| 5,517,148 | 5/1996 | Yin | 330/253 |

OTHER PUBLICATIONS

Groenveld et al., "A Self-Calibration Technique for Monolithic High-Resolution D/A Converters", *IEEE Journal of Solid-State Circuits*, vol. 24, No. 6, Dec. 1989, pp. 1517–1522.

Primary Examiner—Reinhard J. Eisenzopf
Assistant Examiner—Sam Bhattacharya
Attorney, Agent, or Firm—John G. Rauch

[57] ABSTRACT

A communication device (100) employs a local oscillator (104) having an improved charge pump circuit (122). The charge pump circuit (122) has current mirrors (204, 208) in which a first transistor (224, 270) is biased to provide a substantially constant current. A resistor (226, 272) selectively conducts a reference current to bias a mirror transistor (228, 274). The current mirror (204, 208) provides improved dynamic performance thereby reducing global phase error of the communication device (100).

17 Claims, 2 Drawing Sheets

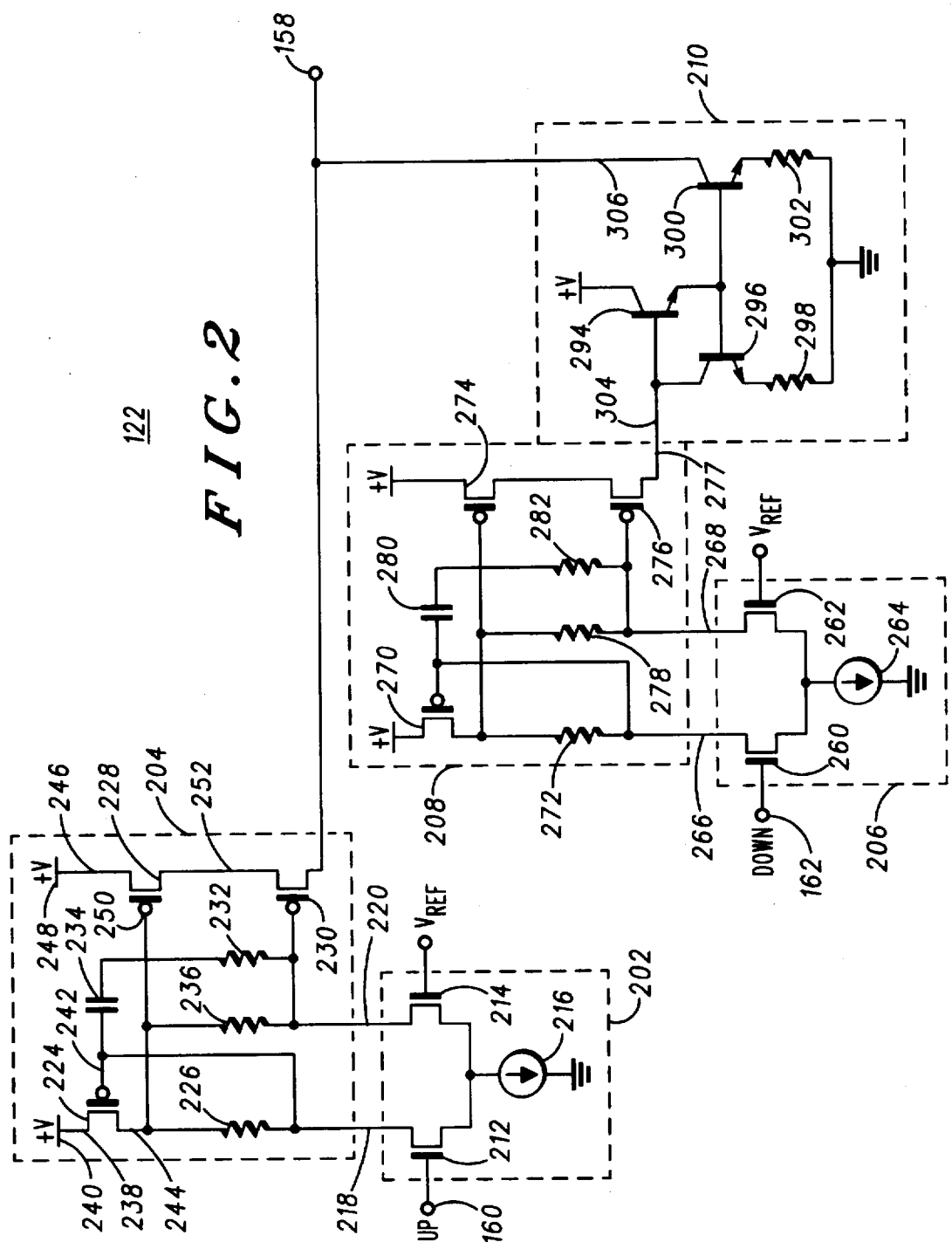

SWITCHING CURRENT MIRROR FOR A PHASE LOCKED LOOP FREQUENCY SYNTHESIZER AND COMMUNICATION DEVICE USING SAME

FIELD OF THE INVENTION

The present invention relates generally to the field of communication devices and more particularly to an improved current mirror for use in a charge pump circuit of a frequency synthesizer.

BACKGROUND OF THE INVENTION

Digital communication devices employ frequency synthesizers for controlling transmission and reception frequency for radio communication. Generally, such a communication device includes a reference oscillator and a local oscillator. The reference oscillator generates a well-controlled reference signal at a known frequency. In response to this reference signal, the local oscillator generates an output signal. This output signal is provided to one or more mixers which are coupled to an antenna of the communication device. The mixers down-convert radio frequency (RF) signals received by the antenna and up-convert RF signals for transmission by the antenna. The frequency of the RF signals which are received or transmitted is controlled by varying the frequency of the local oscillator.

In many digital communication devices, frequency hopping has been adopted as a way of providing diversity of the transmitted RF signals. To enhance received signal quality in the presence of fading conditions or other interference, voice data and other information are transmitted at different times on different frequencies. Interference affecting signals at one frequency is unlikely to affect signals at other frequencies. Thus, on average, a single degraded frequency will not have as large an effect on reception quality.

Frequency hopping requires that the local oscillator of the communication device be able to quickly switch frequencies. In addition, global phase error must be tightly controlled to ensure accurate communication.

One circuit which may be used as a local oscillator has a phase locked loop frequency synthesizer. Such a circuit provides as an output a signal having a well-controlled frequency. In a transmitter using such a phase locked loop frequency synthesizer, the phase jitter of the synthesizer can dominate global phase error. Phase error for such a synthesizer can be determined by integration of the sideband noise of the synthesizer. In communication devices such as digital cellular radiotelephones, in which fast lock time is required, the loop bandwidth of the phase locked loop is on the order of 10 KHz. Thus, the noise from within the loop bandwidth will dominate the phase jitter and thus may dominate global phase error.

An important factor in the noise floor of the frequency synthesizer within the loop bandwidth is the noise performance of the charge pump used in the phase comparator. The charge pump acts in response to an indication of a phase difference between signals supplied by the reference oscillator and signals supplied by a voltage controlled oscillator (VCO) and divider. The charge pump generates phase error correction pulses which are supplied to the loop filter and the voltage controlled oscillator to warp the frequency of the output signal of the VCO, which is the output of the frequency synthesizer.

Known charge pump circuits contain a current source and a current sink to pull the charge pump output voltage up or down, respectively, by providing appropriate current to a capacitive-input loop filter. Performance of the current source in such circuits has been limited by poor performance of PMOS field effect transistors and PNP bipolar transistors. These devices generally switch relatively slowly.

While discharge circuitry has been devised to improve charge pump performance, charge pump speed continues to be a problem. One effect of this problem occurs when both the current source and the current sink are turned on. This occurs during a minimum pulse width time used to ensure the current source and current sink turn on during each reference pulse. Without the minimum pulse width, very short phase error correction pulses are lost because they are not long enough in duration to activate the current source or current sink. The duration of this minimum pulse width is determined by the turn on and turn off times of the current source and current sink. During the minimum pulse width, when both the current source and current sink are turned on, there will be no net transfer of charge to the output of the charge pump. However, there will be a transfer of noise to the output, and from there to the loop filter. This noise results in phase jitter and degrades global phase error for the communication device.

Accordingly, there is a need in the art for an improved charge pump circuit with faster operating speed to allow improved performance in a phase locked loop frequency synthesizer of a communication device.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, and wherein:

FIG. 2 is a schematic diagram of the charge pump of FIG. 1 according to the present invention.

DETAILED DESCRIPTION OF THE PREFERRED EMBODIMENT

Figure 1:
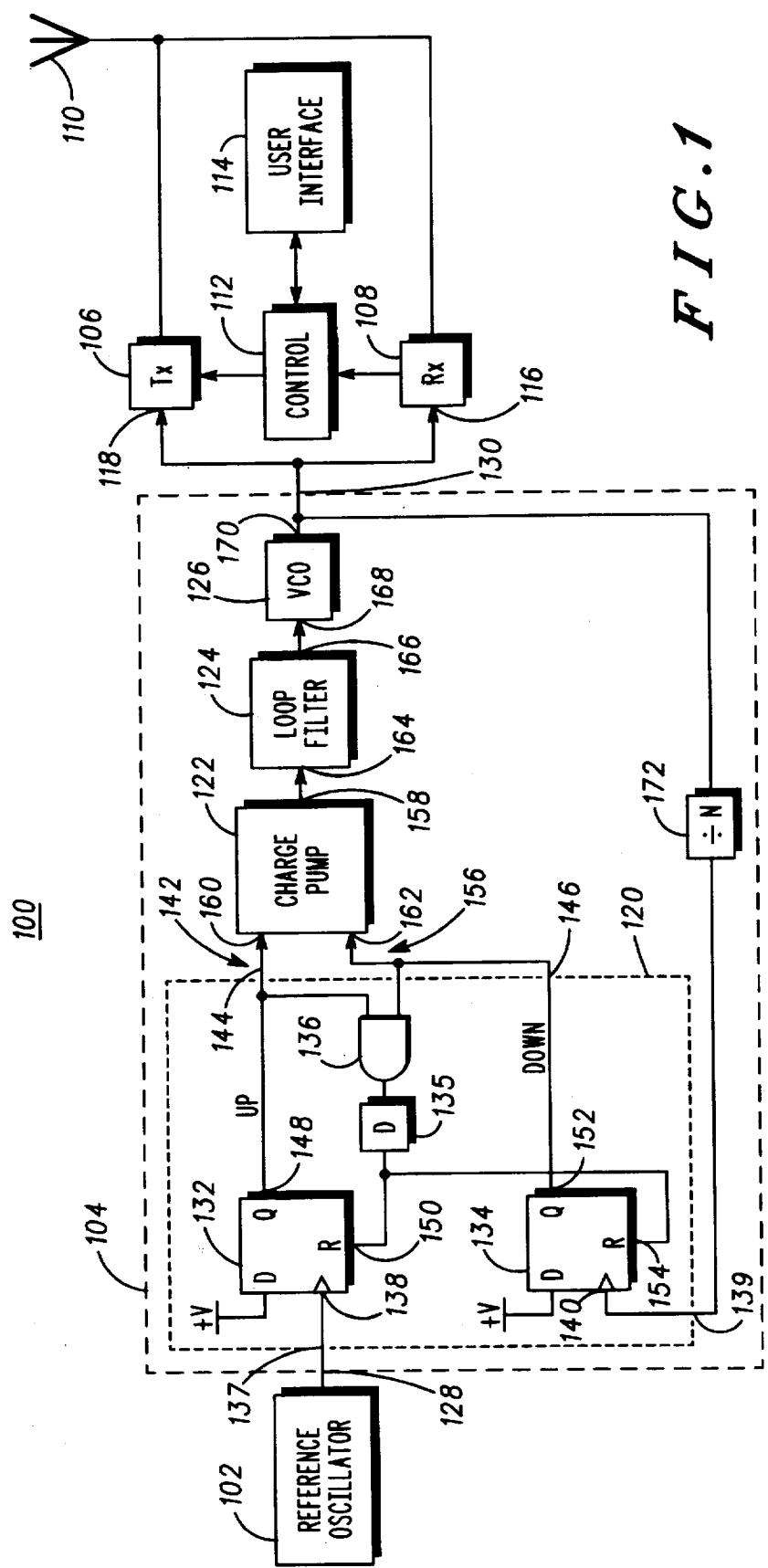
FIG. 1 is a block diagram of a communication device according to the present invention.

Referring now to FIG. 1, it shows a block diagram of a communication device 100 according to the present invention. The communication device 100 may be, for example, a radiotelephone handset such as a cellular telephone handset or a cordless telephone handset, or may be a mobile radio or paging receiver. Generally, the communication device 100 is configured for radio communication with a remotely-located transceiver (not shown).

The communication device 100 includes a reference oscillator 102, a local oscillator 104, transmit circuitry 106, receive circuitry 108, an antenna 110, a controller 112 and a user interface 114. Upon reception of radio frequency (RF) signals, the communication device 100 receives the RF signals through the antenna 110. The antenna 110 converts the RF signals into electrical signals. The receive circuitry 108 converts the electrical signals into electrical baseband signals and extracts the voice, data and other information from the electrical baseband signals. The receive circuitry 108 may include, for example, filter circuits, an intermediate frequency (IF) down-converter including one or more mixers, and a demodulator. The one or more mixers respond to a local oscillator signal received at an input 116 of the receive circuitry 108.

The voice, data and other information is provided by the receive circuitry 108 to the controller 112. The controller 112 formats the data into recognizable voice or other information for use by the user interface 114. The user interface 114 communicates the received information or voice to a user of the communication device 100. Typically, the user interface 114 includes a display, a keypad, a speaker and a microphone (not shown).

Upon transmission of radio frequency (RF) signals from the communication device, the user interface 114 transmits user input data to the controller 112. The controller 112 formats the information obtained from the user interface 114 and transmits it to the transmit circuitry 106 for conversion into modulated RF signals. The transmit circuitry 106 includes appropriate filters, an up-converter including one or more mixers, a power amplifier and an output coupled to the antenna 110 for providing RF signals to the antenna 110. The transmit circuitry 106 has an input 118 for receiving the local oscillator signal from the local oscillator 104 and a second input coupled to the controller 112 for receiving transmit data. The transmit circuitry 106 modulates the transmit data in response to the local oscillator signal.

The reference oscillator 102 is configured to provide a reference signal having a known, generally constant output frequency. The details of the design of such a reference oscillator are well within the purview of one ordinarily skilled in the art.

The local oscillator 104 generally includes a phase comparator 120, a charge pump circuit 122, a loop filter 124 and a voltage controlled oscillator (VCO) 126. The local oscillator 104 has an input 128 for receiving the reference signal from the reference oscillator 102 and an output 130 for providing the local oscillator signal to the transmit circuitry 106 and the receive circuitry 108. Preferably, the local oscillator 104 is fabricated as a single integrated circuit. The local oscillator 104 as illustrated in FIG. 1 is configured as a phase locked loop frequency synthesizer.

The phase comparator 120 has a reference input 137 for receiving the reference signal a feedback input 139 for receiving a feedback signal and an output 142. The output 142 includes an up output 144 and a down output 146. The phase comparator provides a phase adjustment signal at the output 142 in response to a phase difference between the reference signal received at the reference input 137 and the feedback input 139. The phase adjustment signal comprises an up signal provided at the up output 144 and a down signal provided at the down output 146.

The phase comparator 120 includes a D flip-flop 132, a D flip-flop 134, an AND gate 136 and a delay element 135. The phase comparator 120 is configured to receive the reference signal at the clock input 138 of the D flip-flop 132. The data input of the D flip-flop 132 is coupled to a reference potential, such as the positive supply voltage. The phase comparator 120 is further configured to receive the feedback signal at the clock input 140 of the D flip-flop 134. The data input of the D flip-flop 134 is also tied to the reference potential.

The D flip-flop 132 has a data output 148 coupled to the up output 144 of the phase comparator and a reset input 150. The D flip-flop 134 has a data output 152 coupled to the down output of the phase comparator 120 and a reset input 154. The AND gate 136 has a first input coupled to the data output 148 of the D flip-flop 132, a second input coupled to the data output of D flip-flop 134 and an output coupled to delay element 135. The delay element 135 has an output coupled to the reset input 150 of D flip-flop 132 and the reset input 154 of D flip-flop 134. The delay element 135 may include a plurality of inverters or other circuit elements configured to delay receipt of a reset signal from the output of the AND gate at the reset input 150 of D flip-flop 132 and the reset input 154 of D flip-flop 134. The delay element 135 establishes the width of the pulse that will be detected by the charge pump circuit 122. The minimum pulse width is also related to the worst-case response time of the charge pump circuit 122.

The charge pump circuit 122 has an input 156 coupled to the phase comparator output 142 for receiving the phase adjustment signal, and a charge pump output 158 for providing a control signal. The input 156 includes an up input 160 and a down input 162. The preferred structure and operation of the charge pump circuit 122 will be discussed below in conjunction with FIG. 2.

The loop filter 124 has an input 164 coupled to the charge pump output 158. The loop filter 124 further has an output 166. As will be understood by those ordinarily skilled in the art, the loop filter 124 may have any suitable structure, preferably including a capacitive input at the input 164. The design of such a loop filter is well within the capability of those ordinarily skilled in the art.

The voltage controlled oscillator (VCO) 126 has an input 168 coupled to the output 166 of the loop filter 124 and an output 170. The output 170 of the VCO 126 is further coupled to the feedback input 139 of the phase comparator 120 for providing the feedback signal. The voltage controlled oscillator 126 provides a controlled-frequency output signal at the output 170, and at the output 130 of the local oscillator 104, in response to a voltage signal received at the input 168.

The local oscillator 104 may further include a frequency divider 172 in the feedback path from the VCO output 170 to the feedback input 139 of the phase comparator 120. The structure and operation of such frequency dividers are well-known.

Referring now to FIG. 2, it shows a schematic diagram of the charge pump circuit 122 of FIG. 1 according to the present invention. The charge pump circuit 122 includes a first current switch 202, a first current mirror 204, a second current switch 206, a second current mirror 208 and a third current mirror 210. The first current switch 202 has a control input for receiving the phase adjustment signal, specifically the up signal. The second current switch 206 also has a control input for receiving the phase adjustment signal, specifically the down signal.

The first current switch 202 includes a first switching transistor 212, a second switching transistor 214 and a current source 216. Preferably, the first switching transistor 212 and the second switching transistor 214 are NMOS field effect transistors. However, these transistors could alternately be NPN bipolar transistors or any other suitable device. The current source 216 may be any suitable current source configured to provide a reference current. Preferably, the reference current is compensated against variations in temperature and supply voltage. A bandgap reference current source is a well-known example of a suitable current source and the design and implementation of such a current source is well within the purview of one ordinarily skilled in the art. The first current switch 202 may also include level shifting circuitry for shifting the voltage levels and magnitude of the signal received at the up input 160.

The first current switch 202 selectively applies a reference current from one of a first branch and a second branch in response to an input signal received at the up input 160. The first switching transistor 212 has a gate coupled to the up input 160 of the charge pump circuit 122. The second switching transistor 214 has a gate coupled to a reference voltage, designated $V_{REF}$ in FIG. 2. $V_{REF}$ is preferably a DC voltage level compensated against variations in temperature and supply voltage and suitable to provide switching operation of the first current switch 202 in response to switching of the signal received at the gate of the first switching transistor. The first switching transistor 212 has a drain coupled to a first branch 218. The second switching transistor 214 has a drain coupled to a second branch 220. The first switching transistor 212 and the second switching transistor 214 each have a source commonly connected to the current source 216. The first switching transistor 212 receives the phase adjustment signal at the up input 160. The first current switch 202 thus selectively provides the reference current from the current source 216 to one of the first branch and the second branch in response to the phase adjustment signal.

The first current mirror 204 preferably includes a first transistor 224, a resistor 226 and a second transistor 228. In addition, the first current mirror may also include a cascode output transistor 230, a resistor 232, a capacitor 234 and a first biasing resistor 236. Preferably, the first transistor 224 is a PMOS transistor having a source 238 coupled to a supply potential 240, a gate 242 coupled to the first branch 218 and a drain 244. Further, the second transistor 228 is preferably a PMOS transistor having a source 246 coupled to a supply potential 248, a gate 250 coupled to the drain 244 of the first transistor 224 and a drain 282 coupled to the charge pump output 158. In the preferred embodiment, the cascode output transistor 230 is coupled between the drain 252 of the second transistor and the charge pump output 158. The cascode output transistor improves the output impedance of the first current mirror 204. Further, in the preferred embodiment, the resistor 232 and the capacitor 234 are coupled in series between the first branch 218 and the second branch 220.

In operation, if the second switching transistor 214 is on, so that the first current switch 202 provides the reference current to the second branch 220, the first biasing resistor 236 establishes a gate voltage for the cascode output transistor 230. The reference current also flows through the first transistor 224. Since there is no current through the first switching transistor 212, there will be no current in resistor 226, and the gate voltage of the first transistor 224 will be equal to the gate voltage of transistor 228. In this configuration, the two PMOS transistors, first transistor 224 and second transistor 228, will form a current mirror resulting in a current output through second transistor 228 and cascode output transistor 230.

In the preferred embodiment, the second transistor 228 is configured so that the output current provided to the charge pump output 158 is substantially twice the magnitude of the reference current provided by the current source 216. This may be achieved, for example, by establishing a 2:1 ratio of the respective aspect ratios of the second transistor 228 and the first transistor 224.

When the phase adjustment signal received at the up input 160 switches, and the second switching transistor 214 turns off and the first switching transistor 212 turns on, then the reference current will flow in the first branch 218 and through resistor 226 and first transistor 224. The gate voltage of second transistor 228 will then be equal to the gate voltage of first transistor 224 plus the voltage drop across resistor 226. This gate voltage must be sufficient to turn off transistor 228. In the preferred embodiment, the reference current has a value of 200 μA and the resistor 226 has a value of 6K ohms. With second transistor 228 turned off, substantially no output current is provided to the charge pump output 158.

Thus, the first transistor 224 has a gate 242 coupled to the first branch 218 and a drain 244 coupled to the second branch 220 and the first transistor 224 is biased to provide a substantially constant current. The second transistor 228 is coupled between the drain 244 of the first transistor 224 and the resistor 226, the second transistor 228 providing an output current to the charge pump output 158 as a control signal in response to the first current switch 202 providing the reference current to the second branch 220. The second transistor 228 provides substantially no output current in response to the first current switch 202 providing the substantially constant current to the first branch 218. The second transistor 228 is thus biasable in an on state to provide an output current and in an off state to provide substantially no current.

During switching, if the second transistor 228 is initially turned off, then its gate to source capacitance will try to hold the voltage at the resistor 226 near the supply potential. When the first switching transistor 212 turns off and the second switching transistor 214 turns on, then the voltage across the resistor 226 collapses and the charge on the gate to source capacitance of second transistor 228 will force the gate voltage of first transistor 224 to rise until the capacitance discharges. This tends to cause overshoot in the output current provided to the charge pump output 158. If not corrected, this overshoot may be manifested as phase jitter within the loop bandwidth of the local oscillator 104 (FIG. 1). This phase jitter may degrade the global phase error of a communication device, such as communication device 100, employing the charge pump circuit 122.

Accordingly, capacitor 234 and resistor 232 are preferably added to minimize this overshoot problem. When the second switching transistor 214 begins to conduct current, capacitor 234 will initially look like a short circuit and resistor 232 will hold down the gate voltage of first transistor 224 so that the capacitive charge on second transistor 228 cannot cause its gate voltage to rise. After capacitor 234 settles to equilibrium, it appears as an open circuit and has no further effect.

The second current switch 206 includes a first switching transistor 260, a second switching transistor 262 and a current source 264. The first switching transistor 260 has a gate coupled to the down input 162 of the charge pump circuit 122 (FIG. 1) and a drain coupled to a first branch 266. The second switching transistor 262 has a gate coupled to a reference potential, designated $V_{REF}$ in FIG. 2, and a drain coupled to a second branch 268. The current source 264 preferably provides a reference current which is compensated against variations in temperature and supply voltage and may be a bandgap current source. The second current switch 206 may further include level shifting circuitry for shifting voltage levels and magnitude of the signal received at the gate of the first switching transistor 260. Preferably, the second current switch 206 operates substantially identically to the first current switch 202. The second current switch 206 selectively provides a reference current to one of the first branch 266 and the second branch 268 in response to the phase adjustment signal received at the down input 162.

The second current mirror 208 includes a first transistor 270, a resistor 272 and a second transistor 274. In addition, the second current mirror 208 preferably includes a cascode output transistor 276, a second biasing resistor 278, and a capacitor 280 and a resistor 282 coupled in series between the first branch 266 and the second branch 268.

In operation, the second current mirror 208 operates substantially identically to the operation of the first current mirror 204. When the second switching transistor 262 is on, the reference current from the current source 264 flows through the second branch 268 and through the second biasing resistor 278 to set up a gate voltage for the cascode output transistor 276. The reference current also flows through the first transistor 270. Since there is no current through the first switching transistor 260, there will be no current in resistor 272, and thus the gate voltage of the second transistor 274 will be equal to the gate voltage of the first transistor 270. First transistor 270 and second transistor 274 thus will form a current mirror providing a control current at the drain 277 of the cascode output transistor 276. The magnitude of this control current may be adjusted by varying the relative aspect ratios of the first transistor 270 and the second transistor 274.

When the second switching transistor 262 turns off and the first switching transistor 260 turns on, the second current switch 206 will provide the reference current to the first branch 266. The reference current will then flow through resistor 272 and first transistor 270. The gate voltage of second transistor 274 will then be equal to the gate voltage of the first transistor 270 plus the voltage drop across the resistor 272. This gate voltage must be high enough to turn off second transistor 274.

Thus, the first transistor 270 is biased to provide a substantially constant current. The second transistor 274 is coupled between the drain of the first transistor 270 and the resistor 272, the second transistor providing a control current in response to the second current switch 206 providing current to the second branch 268. The second transistor 274 provides substantially no control current in response to the second current switch 206 providing the substantially constant current to the first branch 266.

The third current mirror 210 includes a first transistor 294, a second transistor 296, a first resistor 298, a third transistor 300, and a second resistor 302. The third current mirror further has an input 304 coupled to the drain 277 of the cascode output transistor 276 and an output 306 coupled to the charge pump circuit output 158. The first transistor 294, second transistor 296, and third transistor 300 operate as a current mirror in the manner well-known in the art. Thus, the third current mirror 210 receives the control current at the drain 277 of the second current mirror 208 and provides a mirror current at the output 306 to the charge pump circuit output 158 in response thereto. As will be appreciated by those ordinarily skilled in the art, the third current mirror 210 may include other devices for improving the performance of the third current mirror 210. Similarly, the respective sizes of the transistors or the values of the first resistor 298 and the second resistor 302 may be adjusted to appropriately scale the mirror current provided to the charge pump circuit output 158.

The first current switch 202 and the first current mirror 204 operate as a current source to provide current to the charge pump output 158 in response to the up signal. The second current switch 206, the second current mirror 208 and the third current mirror 210 operate as a current sink, sinking current from the charge pump output 158 in response to the down signal. The signals provided at the charge pump output 158, after filtering by the loop filter 124 (FIG. 1), control the output frequency of the voltage controlled oscillator 126. This output frequency, provided to the receive circuitry 108 and the transmit circuitry 106, controls the frequency of reception and transmission of the communication device 100. Rapid switching of the current mirrors in the charge pump circuit 122 allows a shorter minimum pulse width and therefore lower output noise in a fast hopping frequency synthesizer.

As can be seen from the foregoing, the present invention provides a communication device including an improved charge pump circuit for enhancing operation of a phase locked loop frequency synthesizer. A first current mirror circuit operates as a current source for providing output current. Second and third current mirrors operate as current sink. The configuration of the current mirror has been modified to improve the turn on and turn off transient, thereby overcoming inherent limitations of PMOS devices. This reduces the noise floor within the phase locked loop bandwidth and thereby the global phase error of the communication device.

While a particular embodiment of the present invention has been shown and described, modifications may be made. It is therefore intended in the appended claims to cover all such changes and modifications which fall within the true spirit and scope of the invention.

What is claimed is:

1. A local oscillator for a communication device, the local oscillator comprising:

a phase comparator configured to receive a reference signal and a feedback signal, the phase comparator providing a phase adjustment signal in response to a phase difference between the reference signal and the feedback signal;

a charge pump circuit coupled to the phase comparator to receive the phase adjustment signal and provide a control signal at a charge pump output, the charge pump circuit including:

a first current switch coupled to the phase comparator, the first current switch selectively providing a reference current to one of a first branch and a second branch in response to the phase adjustment signal;

a first current mirror coupled to the first current switch, the first current mirror including a first transistor having a gate coupled to the first branch and a drain coupled to the second branch, the first transistor biased to provide a substantially constant current, the first current mirror further including a resistor coupled between the first branch and the second branch, the first current mirror further including a second transistor coupled between the drain of the first transistor and the resistor, the second transistor providing an output current to the charge pump output as the control signal in response to the first current switch providing current to the second branch, the second transistor providing substantially no output current in response to the first current switch providing substantially no current to the second branch; and a voltage controlled oscillator coupled to the charge pump output for receiving the control signal, the voltage controlled oscillator having an output coupled to the phase comparator for providing the feedback signal.

2. A local oscillator for a communication device as recited in claim 1 wherein the first current mirror further comprises a cascode output transistor coupled between the second transistor and the charge pump output.

3. A local oscillator for a communication device as recited in claim 1 wherein the first current mirror further comprises a resistor and a capacitor coupled in series between the first branch and the second branch.

4. A local oscillator for a communication device as recited in claim 1 wherein the output current is proportional to the substantially constant current.

5. A local oscillator for a communication device as recited in claim 1 wherein the charge pump circuit further comprises:
a second current switch coupled to the phase comparator, the second current switch selectively providing a reference current to one of a first branch and a second branch in response to the phase adjustment signal;
a second current mirror coupled to the second current switch, the second current mirror including a first transistor having a gate coupled to the first branch and a drain coupled to the second branch, the first transistor biased to provide a substantially constant current, the second current mirror further including a resistor coupled between the first branch and the second branch, the second current mirror further including a second transistor coupled between the drain of the first transistor and the resistor, the second transistor providing control current in response to the second current switch providing current to the second branch, the second transistor providing substantially no control current in response to the second current switch providing substantially no current to the second branch; and
a third current mirror coupled to the second current mirror, the third current mirror providing a mirror current to the charge pump output as the control signal in response to the control current.

6. A local oscillator for a communication device as recited in claim 5 wherein the phase adjustment signal comprises an up signal and a down signal, and where the first current switch operates in response to the up signal and the second current switch operates in response to the down signal.

7. A current mirror for use with a current switch which selectively applies a reference current to one of a first branch and a second branch in response to an input signal, the current mirror comprising:
a first transistor having a gate coupled to the first branch and a drain, the first transistor being biased to provide a substantially constant current;
a second transistor having a gate coupled to the drain of the first transistor and to the second branch, the second transistor further having a drain, the second transistor being biasable in an on state to provide an output current and in an off state to provide substantially no current; and
a resistor coupled between the gate of the first transistor and the gate of the second transistor, the resistor conducting the substantially constant current from the first transistor to the first branch to bias the second transistor in the off state when the current switch applies the reference current to the first branch, the resistor conducting substantially no current to bias the second transistor in the on state when the current switch applies the reference current to the second branch.

8. A current mirror as recited in claim 7 wherein the current mirror further comprises a cascode output transistor coupled to the drain of the second transistor for providing the output current.

9. A current mirror as recited in claim 8 wherein the current mirror further comprises a biasing resistor coupled between the gate of the second transistor and the second branch and wherein the cascode output transistor includes a gate coupled to the second branch and a source coupled to the drain of the second transistor.

10. A current mirror as recited in claim 8 wherein the current mirror further comprises a resistor and a capacitor coupled in series between the first branch and the second branch.

11. A communication device, comprising:
an antenna;
receive circuitry coupled to the antenna;
a reference oscillator;
a local oscillator, the local oscillator including:
a phase comparator having a reference input coupled to the reference oscillator for receiving a reference signal, a feedback input for receiving a feedback signal and an output, the phase comparator providing a phase adjustment signal in response to a phase difference between the reference signal and the feedback signal,
a charge pump circuit having an input coupled to the output of the phase comparator for receiving the phase adjustment signal and a charge pump output for providing a control signal, the charge pump circuit including:
a first current switch having a control input for receiving the phase adjustment signal, the first current switch selectively providing a reference current to one of a first branch and a second branch in response to the phase adjustment signal;
a first current mirror coupled to the first current switch, the first current mirror including a first transistor having a gate coupled to the first branch and a drain, the first transistor being biased to provide a substantially constant current, a second transistor having a gate coupled to the drain of the first transistor and to the second branch, the second transistor further having a drain coupled to the charge pump output, the second transistor being biasable in an on state to provide an output current to the charge pump output and in an off state to provide substantially no current, and a resistor coupled between the gate of the first transistor and the gate of the second transistor, the resistor conducting the substantially constant current from the first transistor to the first branch to bias the second transistor in the off state when the first current switch provides the reference current to the first branch, the resistor conducting substantially no current to bias the second transistor in the on state when the first current switch provides the reference current to the second branch;
a loop filter having an input coupled to the charge pump output and an output;
a voltage controlled oscillator having an input coupled to the output of the loop filter and an output, the output of the voltage controlled oscillator being coupled to the feedback input for providing the feedback signal;
a controller; and
transmit circuitry having a first input coupled to the output of the voltage controlled oscillator for receiving a local oscillator signal and a second input coupled to the controller for receiving transmit data and an output coupled to the antenna, the transmit circuitry modulating the transmit data in response to the local oscillator signal.

12. A communication device as recited in claim 11 further comprising receive circuitry coupled to the voltage controlled oscillator and the antenna for receiving radio communication.

13. A communication device as recited in claim 12 wherein the communication device comprises a radiotelephone.

14. A communication device as recited in claim 11 wherein the charge pump circuit further comprises:

a biasing resistor coupled between the gate of the second transistor and the second branch; and a cascode output transistor coupled between the drain of the second transistor and the charge pump output for providing the output current, the cascode output transistor having a gate coupled to the second branch for controlling the cascode output transistor.

15. A communication device as recited in claim 14 wherein the charge pump circuit further comprises a resistor and a capacitor coupled in series between the first branch and the second branch.

16. A communication device as recited in claim 11 wherein the phase adjustment signal includes an up signal and a down signal the first current switch receiving the up signal at the control input of the first current switch, and wherein the charge pump circuit further comprises:

a second current switch having a control input coupled to the output of the phase comparator for receiving the down signal, the second current switch selectively providing a reference current to one of a first branch and a second branch in response to the phase adjustment signal;

a second current mirror coupled to the second current switch, the second current mirror including a first transistor having a gate coupled to the first branch and a drain, the first transistor being biased to provide a substantially constant current, a second transistor having a gate coupled to the drain of the first transistor and to the second branch, the second transistor further having a drain, the second transistor being biasable in an on state to provide an output current and in an off state to provide substantially no current, and a resistor coupled between the gate of the first transistor and the gate of the second transistor, the resistor conducting the substantially constant current from the first transistor to the first branch to bias the second transistor in the off state in response to the second current switch applying the reference current to the first branch, the resistor conducting substantially no current to bias the second transistor in the on state in response to the second current switch providing the reference current to the second branch; and a third current mirror having an input coupled to the drain of the second transistor of the second current mirror and an output coupled to the charge pump output, the third current mirror receiving the output current of the second current mirror and providing a mirror current to the charge pump output in response thereto.

17. A communication device as recited in claim 16 wherein the charge pump circuit further comprises:

at the first current mirror, a first biasing resistor coupled between the gate of the second transistor and the second branch and a first cascode output transistor coupled between the drain of the second transistor and the charge pump output for providing the output current, the first cascode output transistor having a gate coupled to the second branch for controlling the first cascode output transistor; and at the second current mirror, a second biasing resistor coupled between the gate of the second transistor and the second branch and a second cascode output transistor coupled between the drain of the second transistor and the input of the third current mirror for providing the output current, the second cascode output transistor having a gate coupled to the second branch for controlling the second cascode output transistor.

* * * * *